United States Patent [19]
Ushikubo et al.

[11] Patent Number: 5,548,475
[45] Date of Patent: Aug. 20, 1996

[54] DIELECTRIC THIN FILM DEVICE

[75] Inventors: Maho Ushikubo, Kashiwa; Yasuyuki Itoh, Tenri, both of Japan

[73] Assignee: Sharp Kabushiki Kaisha, Osaka, Japan

[21] Appl. No.: 334,039

[22] Filed: Nov. 2, 1994

[30] Foreign Application Priority Data

Nov. 15, 1993 [JP] Japan ................................ 5-284982
May 23, 1994 [JP] Japan ................................ 6-108628

[51] Int. Cl.⁶ ........................... H01G 4/06; G11C 11/22; G11C 11/24
[52] U.S. Cl. ...................... 361/321.4; 361/313; 257/295; 365/149; 365/145
[58] Field of Search ........................... 361/321.1, 321.2, 361/321.3, 321.4, 321.5, 311–314, 320; 257/295; 365/145, 149

[56] References Cited

FOREIGN PATENT DOCUMENTS

| 3-108770 | 5/1991 | Japan . |
| 3-108192 | 5/1991 | Japan . |
| 5235268 | 9/1993 | Japan . |

OTHER PUBLICATIONS

Nakamura, Takashi et al. "Preparation of C–Axis–Oriented . . . , " Japan Journal of Applied Phys., vol. 32, (1993) pp. 4086–4088.

Primary Examiner—Bot L. Ledynh

[57] ABSTRACT

A dielectric thin film device comprising at least an electrode and a dielectric thin film, said dielectric thin film being a laminate of a plurality of layers whose compositions comprise the same kinds of atoms including volatile atom(s) but are different in the content of the volatile atom(s) in at least one layer from the other.

10 Claims, 9 Drawing Sheets

DIELECTRIC THIN FILM DEVICE

BACKGROUND OF THE INVENTION

1. Field of the Invention

The present invention relates to a dielectric thin film device and a method for manufacturing the same. More particularly, the invention relates to a dielectric thin film device for use in non-volatile memory devices, capacitors, light modulation devices, piezoelectric devices and pyroelectric infrared rays sensors or the like, and a method for manufacturing the same.

2. Description of the Related Art

Generally speaking, capacitors comprising a dielectric thin film accumulate an electric charge in DRAM's or the like. As a material for the dielectric thin film for capacitors, $SiO_2$ (silicon oxide) is primarily used. Furthermore, a higher integration of semiconductor device is demanded in recent years so that high dielectric thin films have been researched which use such materials as $SrTiO_3$ (strontium titanate), (Ba, Sr) $TiO_3$ (barium strontium titanate) or the like.

Also, non-volatile memories which use ferroelectric materials exhibiting a spontaneous polarization have been studied out of various kinds of dielectric materials. Examples of materials that can be used in such ferroelectric materials include oxides such as PZT [$Pb(Zr, Ti)O_3$, lead zirconate titanate], $PbTiO_3$ (lead titanate), and $BaTiO_3$ (barium titanate) or the like. Out of such materials, PZT has been briskly studied as a promising material for non-volatile memories.

Along with the miniaturization and integration of electronic components resulting from an advancement of the semiconductor technology, dielectric thin film devices have reduced in size and thickness. Further demand has been made on dielectric thin films free from defects.

Methods for manufacturing dielectric thin films as mentioned above intend to utilize vacuum deposition method, sputtering method, sol-gel method, metal organic chemical vapor deposition (MOCVD) method or the like. The methods falls into two types; one type involving crystallization during the deposition of dielectric film forming process by raising temperature of substrate whereas the other type involving crystallization through heat treatment after the deposition of dielectric film. Both methods have a defect because when the dielectric thin film contains atom(s) that easily evaporates, many pin holes are formed in the dielectric thin film and uneven patterns on the surface thereof becomes larger due to reevaporation of volatile atom(s) during the crystallization. Thus, such dielectric thin film causes a problem that the leak current increases and the properties of cells get non-uniform. Consequently, it has been very difficult to thin down the thickness of the dielectric thin film along with the higher integration of semiconductor device.

In order to solve such problem, the former method raising temperature of substrate must maintain a high temperature of 500° to 700° C. for the substrate and slow down the rate of film formation which however lowers in productivity. In the latter method, when comparatively volatile atom(s) such as Pb or the like are used as dielectric materials, the film before heat treatment must be rich in Pb or the like so as to compensate a predetermined stoichiometric composition of the resulting dielectric film.

Besides, the ferroelectric thin film devices disclosed in Japanese Unexamined Patent Publication No. HEI 3-108192 and Japanese Unexamined Patent Publication No. HEI 3-108770 have a structure such that ferroelectric thin films constituting the device comprise a plurality of layers made different kinds of ferroelectric materials which may contain of a third atom. Such structures change a coercive field only to prevent a remnant polarization value from lowering, but they fail to prevent the formation of pin holes on the surface of dielectric thin films.

SUMMARY OF THE INVENTION

Therefore, the present invention provides a dielectric thin film device comprising at least an electrode and a dielectric thin film, said dielectric thin film being a laminate of a plurality of layers whose compositions comprise the same kinds of atoms including volatile atom(s) but are different in the content of the volatile atom(s) in at least one layer from the other.

Furthermore, the present invention provides a process for forming the dielectric thin film device as mentioned above comprising forming the dielectric thin film of multilayer by use of the conventional method as per se selected form the group consisting of RF magnetron sputtering method, metal organic chemical vapor deposition method, ion beam sputtering method and sol-gel method, and optionally subjecting the resulting film to heat-treatment for crystallization.

DESCRIPTION OF THE PREFERRED EMBODIMENTS

Figure 18:
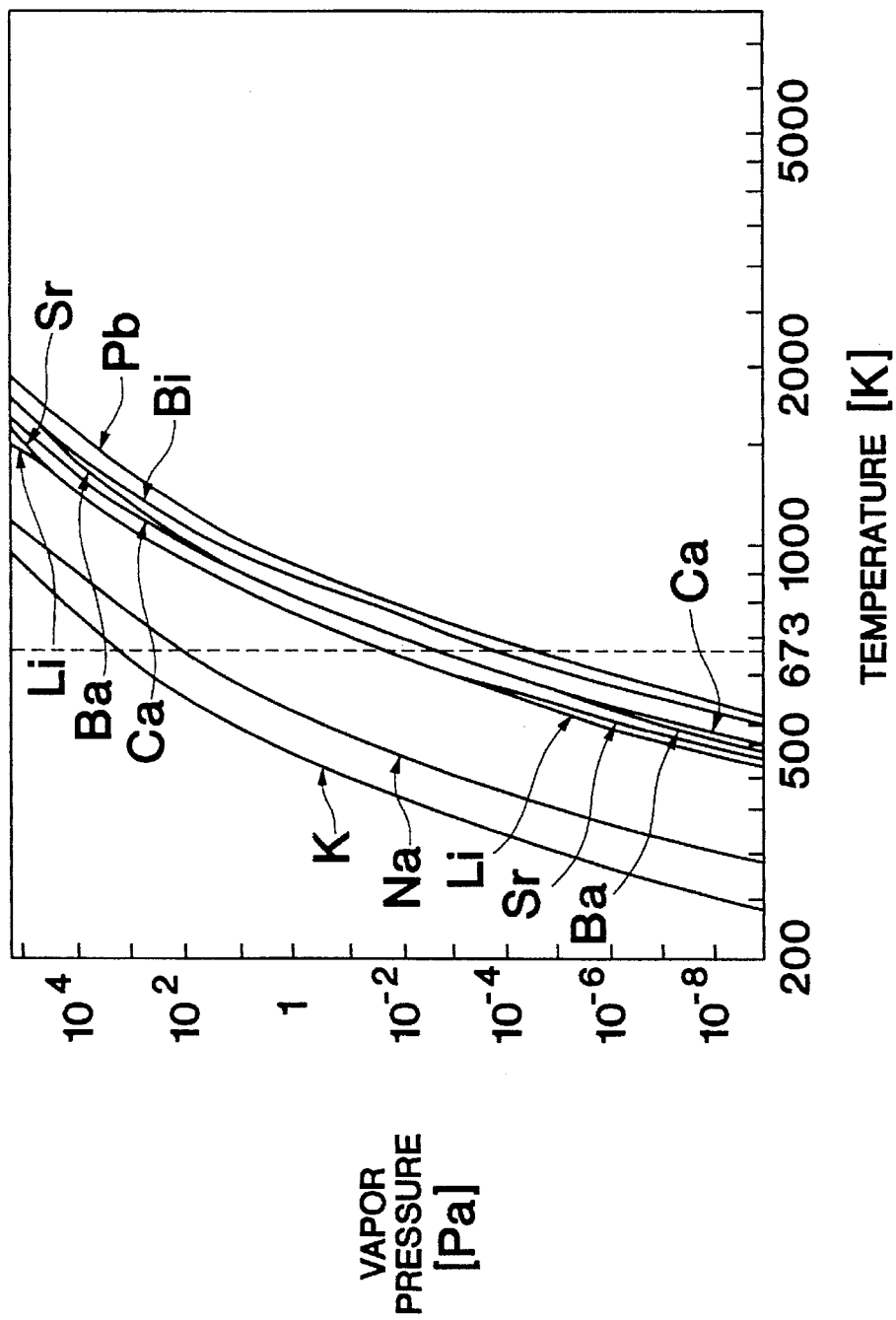
FIG. 18 is vapor pressure curves of volatile atoms.

Volatile atoms as used in the present invention refer to atoms that may evaporate during heat treatment at a high temperature after the formation of the dielectric thin film. Generally, the heat treatment is performed at 400° C. (673K) or higher at which atoms showing a vapor pressure of $10^{-6}$ Pa or more tend to evaporate. Specifically, the volatile atoms include lead, bismuth, strontium, barium, lithium, calcium, potassium, sodium or the like. FIG. 18 shows vapor pressure curves of these volatile atoms. As apparent in FIG. 18, any of the aforementioned atoms has a vapor pressure of $10^{-6}$ Pa or more at 400° C.

The dielectric thin film device of the present invention can be applied to any devices as long as the devices need to provide at least an electrode and a dielectric thin film which utilize such effect as ferroelectric effect, piezoelectric effect, pyroelectric effect or electro-optic effect. Examples of such devices include a semiconductor device having a capacitor structure, a light modulation device, a ultrasonic sensor, and an infrared ray linear array sensor.

Dielectric materials usable in the present invention are those which contain at least one kind of volatile atoms such as lead, bismuth, strontium, barium, lithium, calcium, potassium, or sodium. Examples of such materials include materials having a high dielectric constant such as $SrTiO_3$, $(Ba_xSr_{1-x})TiO_3$, $CaBi_4O_{15}$, $NaNbO$ or ferroelectric materials such as PZT, $(Pb_xLa_{1-x})TiO_3$, PLZT $[(Pb_xLa_{1-x})(Zr_yTi_{1-y})O_3]$, $Bi_4Ti_3O_{12}$, $BaTiO_3$, $BaMgF_4$, $LiNbO_3$, $LiTaO_3$, or $KNbO_3$.

Preferable materials having a high dielectric constant are $SrTiO_3$ and $(Ba_xSr_{1-x})TiO_3$, while preferable ferroelectric materials are PZT, PLZT and $Bi_4Ti_3O_{12}$.

The dielectric thin film formed of the aforementioned material comprises a plurality of layers which are composed of the same atoms but are different composition ratio of volatile atoms. Preferably, the dielectric thin film of the present invention comprises at least three layers. When the dielectric thin film has three layers, the intermediate layer desirably contains a smaller content of volatile atoms than the remaining two layers. The content of the volatile atoms differs depending on the kind thereof. The present invention can be applied to the structure having three or more layers. The object of the present invention can be attained when the intermediate layer contains a smaller content of the volatile atoms than the upper and lower layers which sandwich the intermediate layer.

A preferable method for manufacturing the dielectric thin film of the present invention includes any of the conventional methods such as RF magnetron sputtering method, metal organic chemical vapor deposition (MOCVD) method, ion beam sputtering method, vacuum deposition method, and sol-gel method. Out of such methods, the RF magnetron sputtering method, MOCVD method and ion beam sputtering method are preferable.

When a multi-layered film is formed by RF magnetron sputtering method, followed by crystallization with heat treatment, the multi-layered film having a different composition ratio in their layers can be formed by changing the ratio of flow rate of a sputtering gas under the common condition for each of the layers such as a substrate temperature of room temperature to 450° C., a sputtering power of 100 to 1000 W, and a sputtering gas pressure of 0.1 to 1 Pa. As the sputtering gas, a known gas such as $Ar/O_2$ can be used. The dielectric thin film formed by this method requires to be annealed for crystallization. Conditions thereof are appropriately set depending on the material used and the composition ratio thereof.

When MOCVD method is used, a substrate temperature is set to 500° to 800° C. and a known gas is used as a material gas for forming a dielectric thin film. In addition, the composition ratio of the dielectric thin film is adjusted with change in flow rate of a carrier gas that flows each material gases. A known gas such as $N_2$ can be used as a carrier gas.

When ion beam sputtering method is used, a substrate temperature of 400° to 700° C. and an ion beam acceleration voltage of 800 to 1200 V can be used for the formation of each layers, while a sputtering gas is changed in the same manner as the aforementioned RF magnetron sputtering.

In addition, it goes without saying that the aforementioned film forming conditions somewhat differ depending on the difference in the dielectric thin film thus formed.

Then, a known material such as Pt, Al, Cu, and RuO2 can be used for the formation of electrode film for upper and lower electrodes in the present invention. Preferably, the thickness of such electrode film is set to 50 to 5000 Å.

Furthermore, the dielectric thin film of the present invention is preferably formed on a substrate. A known material can be used in the substrate. Such materials as silicon or GaAs can be used therein. Still furthermore, an Si thermal oxidation film for insulating between the substrate and the lower electrode film, and a Ti film for improving adhesion between the lower electrode film and the Si thermal oxidation film may be formed when they are required. Preferably, the thickness of these films are 50 to 5000 Å and 50 to 2000 Å, respectively.

EXAMPLE 1

Figure 1:
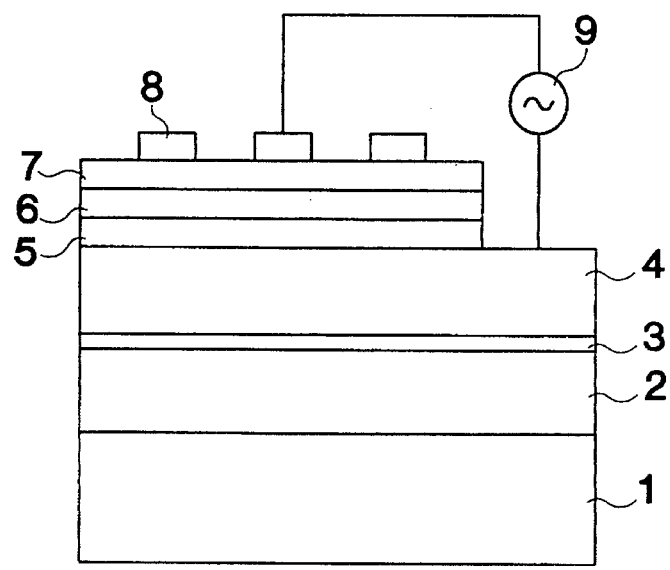
FIG. 1 is a schematic sectional view showing a structure of a dielectric thin film device according to example 1 of the present invention.

FIG. 1 is a schematic sectional view showing a cross section of a structure of a dielectric thin film device according to the present invention, the structure being formed for the evaluation of electric properties described later. Reference numeral 1 designates an N-type silicon substrate, 2 an Si thermal oxidation film formed on the surface of the aforementioned N-type silicon substrate 1, 3 a Ti film formed on the aforementioned Si thermal oxidation film 2, 4 a Pt lower electrode formed on the aforementioned Ti film 3, 5 a first layer of a ferroelectric PZT film formed on the Pt lower electrode 4, 6 a second layer of the ferroelectric PZT film formed on the first layer 5 of the ferroelectric PZT film, 7 a third layer of the ferroelectric PZT film formed on the second layer 6 of the aforementioned ferroelectric PZT film, and 8 a Pt upper electrode formed on the third layer 7 of the aforementioned ferroelectric PZT film.

On the surface of the N-type silicon substrate 1, a 2000 Å thick Si thermal oxidation film 2, a 300 Å thick Ti film 3 and a 2000 Å thick Pt film 4 in this order were formed, respectively. On this Pt film 4, PZT films 5, 6 and 7 were formed as a ferroelectric film by the RF magnetron sputtering method. Incidentally, common conditions for forming PZT films 5, 6 and 7 were as follows; the substrate temperature was set to 250° C., the sputtering power to 700 W, and the sputtering gas pressure to 0.4 Pa. The PZT films 5 and 7 were formed to a thickness of 700 Å at a sputtering gas flow rate of ratio $Ar/O_2$ of 3/1 whereas the PZT film 6 were formed to a thickness of 700 Å at a sputtering gas rate of ratio $Ar/O_2$ of 2/1. Therefore, the total thickness of the three PZT films was 2100 Å. A composition ratio in the film was Pb: Ti: Zr=0.57: 0.22: 0.21 when the film was formed under the same film forming condition as PZT films 5 and 7 whereas the composition ratio in a film was Pb: Ti: Zr=0.53: 0.24: 0.23 when the film was formed under the same film forming condition as PZT film 6.

These PZT films 5, 6 and 7 were heat-treated with a rapid thermal annealing apparatus using an infrared lamp for crystallization. Heat treatment conditions were as follows; the temperature rising and falling rate at the atmosphere, i.e., pressure under of 100% oxygen was 35° C./sec, the annealing temperature was 600° C., and the annealing time was 15 sec. The composition ratio in the film after the heat treatment when the film was formed under the same film forming condition as the PZT films 5 and 7 were Pb: Ti: Zr=0.55: 0.23: 0:22 whereas the composition ratio in the film when the film was formed under the same film forming conditions as the PZT film 6 was Pb: Ti: Zr=0.49: 0.26: 0.25. The result of the X-ray diffraction analysis of the film after the heat treatment showed that only the peak of the single layer PZT film having a Perovskite structure appeared. Thus, it was confirmed that the film had been crystallized. In addition, the SEM observation showed that no pin holes have been formed in the PZT film.

After crystallization through heat treatment, the Pt upper electrode 8 was formed on the surface of the PZT film 7 by vacuum deposition method. The Pt upper electrode 8 was rectangular having a size of 60 μm×60 μm and a thickness of 200 Å.

Figure 3:
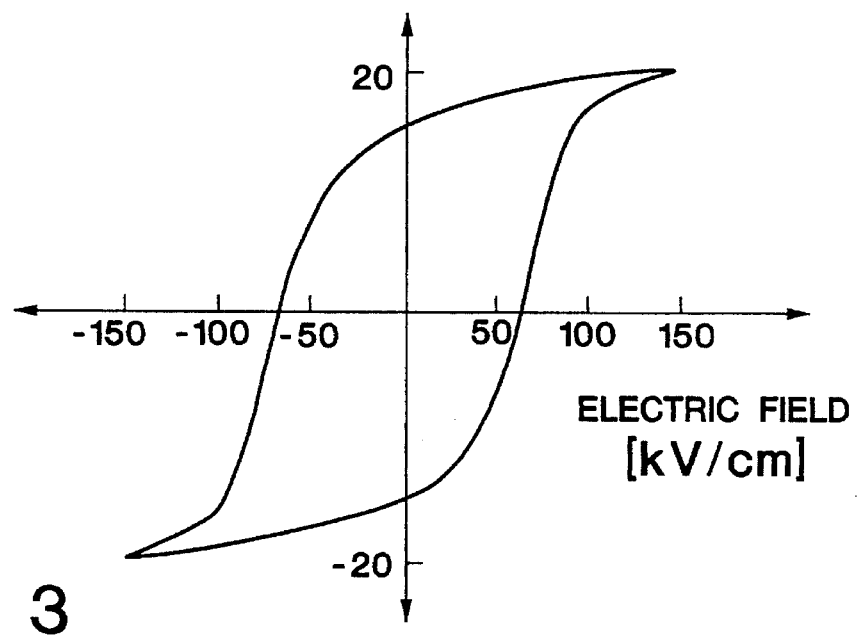
FIG. 3 is a hysteresis loop obtained by the dielectric thin film device according to example 1 of the present invention.

FIG. 3 shows a hysteresis loop obtained by applying an electric field 9 between the Pt upper electrode 8 and the Pt lower electrode 4 in the ferroelectric thin film device prepared by the aforementioned method. The applied electric field 9 was a triangular wave having an intensity of 150 kV and a frequency of 75 Hz. The hysteresis loop shows that ferroelectric properties were obtained which was sufficient to be used as a ferroelectric memory device.

EXAMPLE 2

The structure for evaluating the dielectric thin film device of the present invention was the same as example 1. However, the method for manufacturing the dielectric thin film and the composition ratio was different from example 1.

Example 2 of the present invention will be explained in conjunction with FIG. 1.

PZT films 5, 6 and 7 were formed under the following common conditions; the substrate temperature was set to 250° C., the sputtering power to 700 W, and the sputtering gas pressure was set to 0.4 Pa. The PZT films 5 and 7 were formed to a thickness of 700 Å at a sputtering gas flow rate ratio of $Ar/O_2$=3/1 whereas the PZT film 6 was formed to a thickness of 700 Å at sputtering gas flow rate ratio of $Ar/O_2$=1/1 with the result that the total thickness of the three PZT films became 2100 Å. A composition ratio in the film was Pb: Ti: Zr=0.57: 0.22: 0:21 when the film was independently formed under the same film forming condition as the PZT films 5 and 7 whereas the composition ratio in the film was Pb: Ti: Zr=0.51: 0.25: 0.24 when the film was formed under the same film forming conditions as the PZT films 6.

The PZT films 5, 6 and 7 were heat treated with a high speed annealing apparatus using an infrared rays lamp for crystallization. The heat treatment conditions were as follows; the temperature rising and falling rate in the atmosphere of 100% oxygen was 35° C./sec, the annealing temperature was 600° C. and the annealing time was 15 sec. A composition ratio in the film after heat treatment was Pb: Ti: Zr=0.55: 0.23: 0.22 when the film was independently formed under the same film conditions as PZT films 5 and 7 whereas the composition ratio in the film was Pb: Ti: Zr=0.47: 0.27: 0.26 when the film was independently formed under the same film forming condition as the PZT film 6. The result of the X-ray diffraction analysis showed that only the peak of the PZT single layer having a Perovskite structure appeared. Thus it has been confirmed that the film has been crystallized. In addition, the SEM observation of the film cross section shows that no pin holes were observed in the PZT film.

Ferroelectric properties sufficient to be used as a ferroelectric memory device in the same manner as example 1 was obtained by applying an electric field 9 between the Pt upper electrode 8 and the Pt lower electrode 4.

COMPARATIVE EXAMPLE 1

Figure 2:
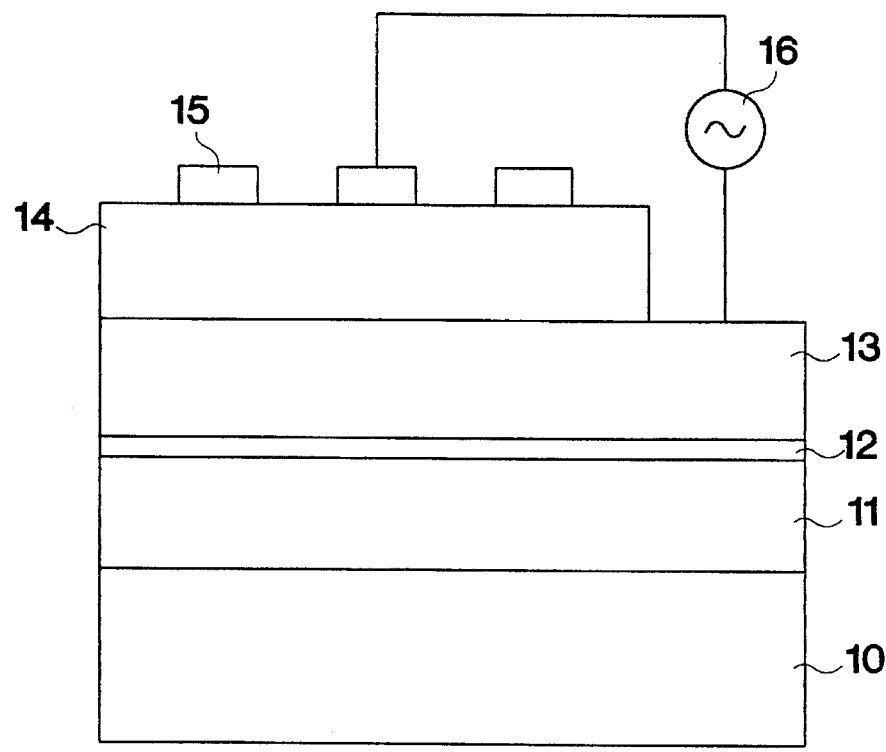
FIG. 2 is a schematic sectional view showing a structure of a dielectric thin film device according to comparative example 1.

FIG. 2 is a schematic view showing one sectional structure for illustrating a conventional dielectric thin film device. Referring to FIG. 2, reference numeral 10 designates an N-type silicon substrate, 11 an Si thermal oxidation film formed on the surface of the N-type silicon substrate 10, 12 a Ti film formed on the Si thermal oxidation film 11, 13 a Pt lower electrode formed on the Ti film 12, 14 a ferroelectric PZT film formed on the Pt lower electrode 13, 15 a Pt upper electrode formed on the ferroelectric PZT film 14. The film forming conditions and heat treatment method for films except for the PZT films 14 were set to be the same as examples 1 and 2. The film forming conditions for forming the PZT film 14 were as follows; the substrate temperature was set to 250° C., the sputtering power to 700 W, and the sputtering gas pressure to 0.4 Pa, and the flow rate ratio of the sputtering gas was set to $Ar/O_2$=3/1. The heat treatment conditions were as follows; the temperature rising and falling rate in the atmosphere of 100% oxygen was 35° C./sec, the annealing temperature was set to 600° C. and the annealing time was set to 15 sec. The result of the X-ray defraction analysis shows only the peak of the PZT single layer having a Perovskite structure appeared. Thus, it was confirmed that the film had been crystallized. In addition, the SEM observation of the film cross section shows that a large number of pin holes were formed to a size of 500 to 1000 Å in the PZT film.

Figure 4:
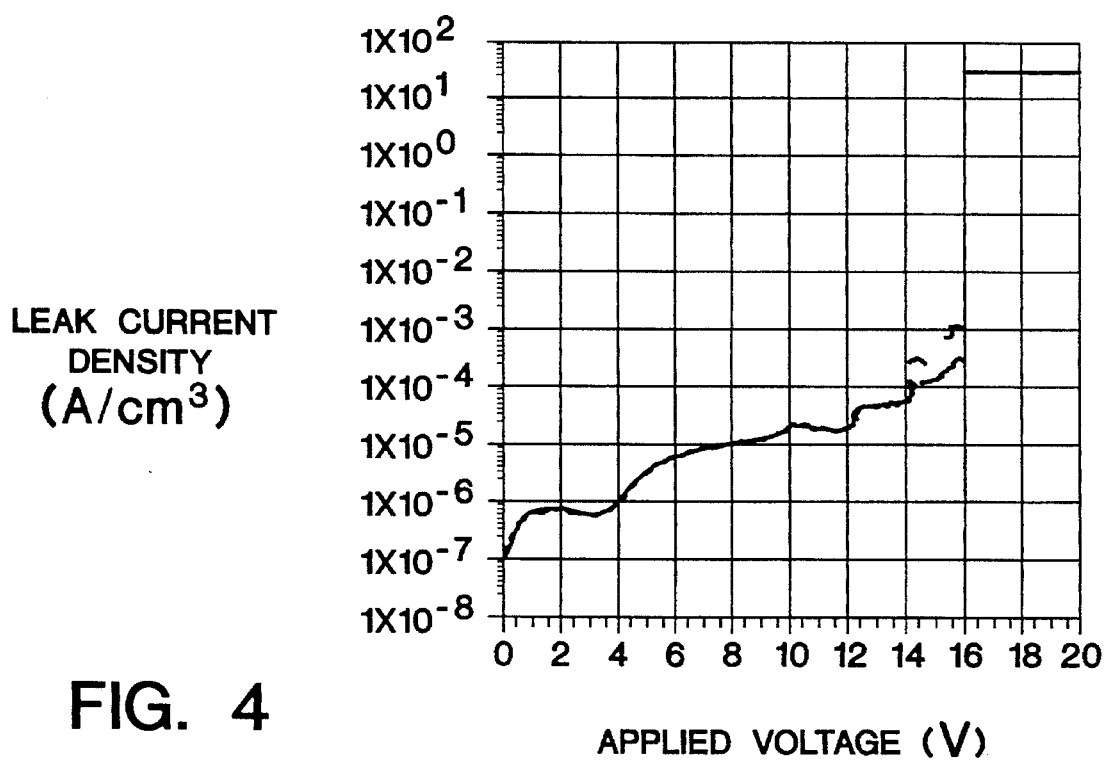
FIG. 4 is a view showing I-V properties obtained by the dielectric thin film device according to example 1 of the present invention.
Figure 5:
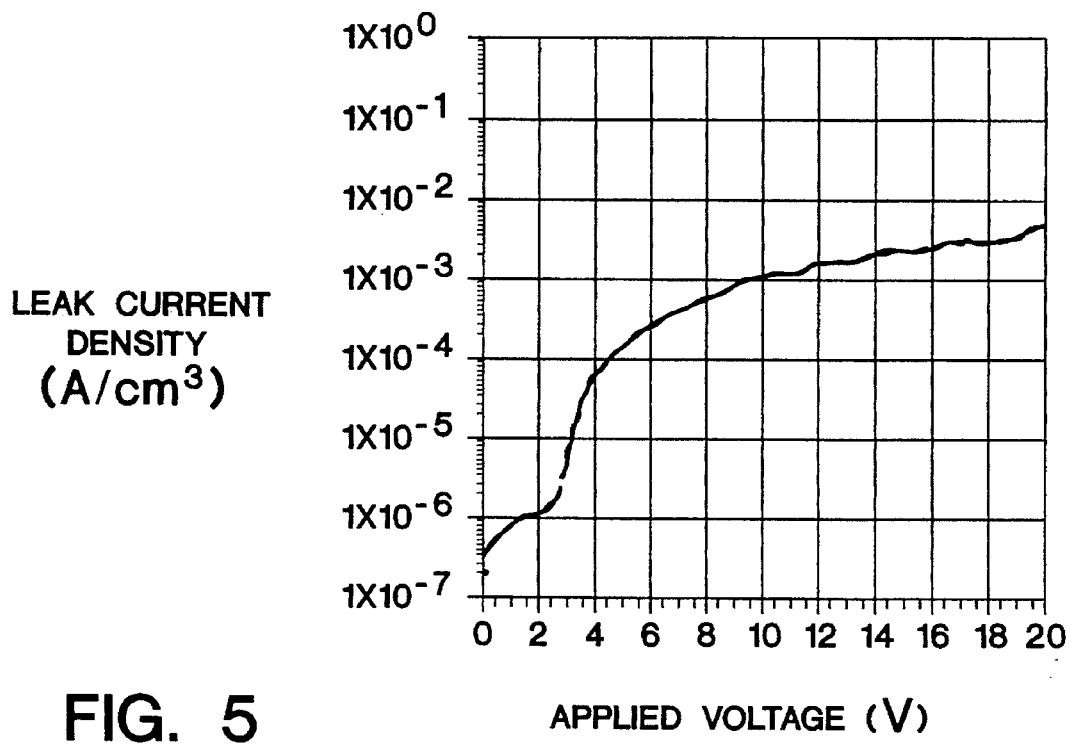
FIG. 5 is a view showing I-V properties obtained by the dielectric thin film device according to example 2 of the present invention.
Figure 6:
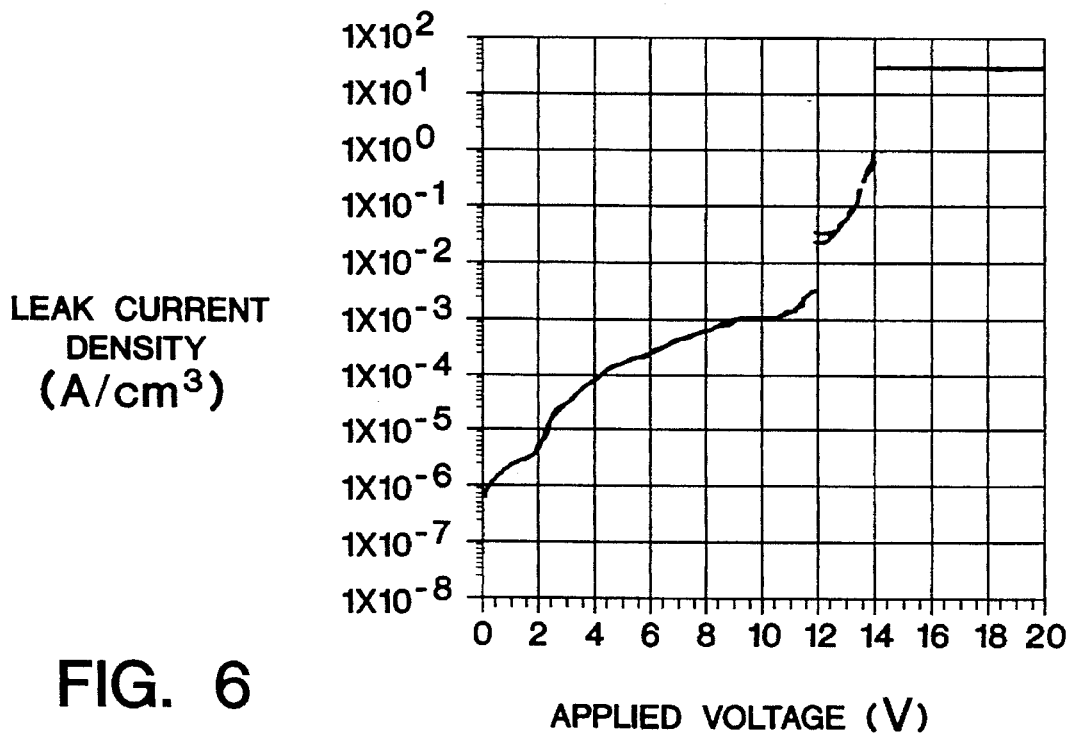
FIG. 6 is a view showing I-V properties obtained by the dielectric thin film device according to comparative example 1.

FIGS. 4 through 6 show graphs for comparing I-V properties between the dielectric thin film device according to examples 1 and 2 of the present invention and the conventional dielectric thin film device in comparative example 1. The graphs show that the dielectric thin film device of the present invention has been improved both in leak current and the insulation dielectric strength, and that the film has favorable properties as a dielectric memory device.

EXAMPLE 3

Example 3 of the present invention will be detailed in conjunction with FIG. 1 hereinbelow.

A structure for evaluating a dielectric thin film device of the present invention is the same as example 1. However, the method for forming the dielectric thin film and the composition ratio were different from example 1.

On the surface of the N-type silicon substrate 1, the Si thermal oxidation film 2 was formed to a thickness of 2000 Å. On the Si thermal oxidation film 2, a Ti film 3 was formed to a thickness of 300 Å. On the Ti film 3, a Pt film 4 was formed to a thickness of 2000 Å. Then, on the Pt film 4, PZT films 5, 6 and 7 were formed on the Pt film 4 by the MOCVD method, respectively. As materials for Pb, Zr and Ti, Pb(DPM)2 (DPM: dipivaloylmethane, $C_{11}H_{20}O_2$), Zr(O-t-$C_4H_9)_4$ and Ti (O-i-$C_3H_7)_4$ were used to form a film at 700° C. In the PZT films 5 and 7, the flow rate $F_{Pb}$ of $N_2$ carrier gas with respect to Pb(DPM)2 was set to 150 sccm, the flow rate $F_{zr}$ of $N_2$ carrier gas with respect to Zr (O-t-$C_4H_7)_4$ was set to 50 sccm, the flow rate $F_{Ti}$ of $N_2$ carrier gas with respect to Ti (O-i-$C_3H7)_4$ was set to 100 sccm, the flow rate $F_{O2}$ of O2 dilute gas was set to 700 sccm and the flow rate $F_{N2}$ of $N_2$ dilute gas was set to 300 sccm. In PZT film 6, $F_{pb}$ was set to 100 sccm, Fzr was set to 50 sccm, FTi was set to 100 sccm, $FO_2$ was set to 700 sccm, and FN2 was set to 350 sccm. Then, each of the films were formed to a thickness of 700 Å so that the total thickness of the films was set to 2100 Å. A composition ratio in the film when the film was independently formed under the same film forming conditions as the PZT films 5 and 7 was Pb: Ti: Zr=0.50: 0:21: 0:29 whereas the composition ratio in the film when the film was formed under the same film forming condition as the PZT film 6 was Pb: Ti: Zr=0.47: 0.22: 0.31.

After PZT films 5, 6 and 7 were formed, the Pt upper electrode 8 was formed on the surface of the PZT film 7 by vacuum deposition method. The Pt upper electrode 8 was rectangular having a size of 60 μm×60 μm and a thickness of 2000 Å.

Figure 7:
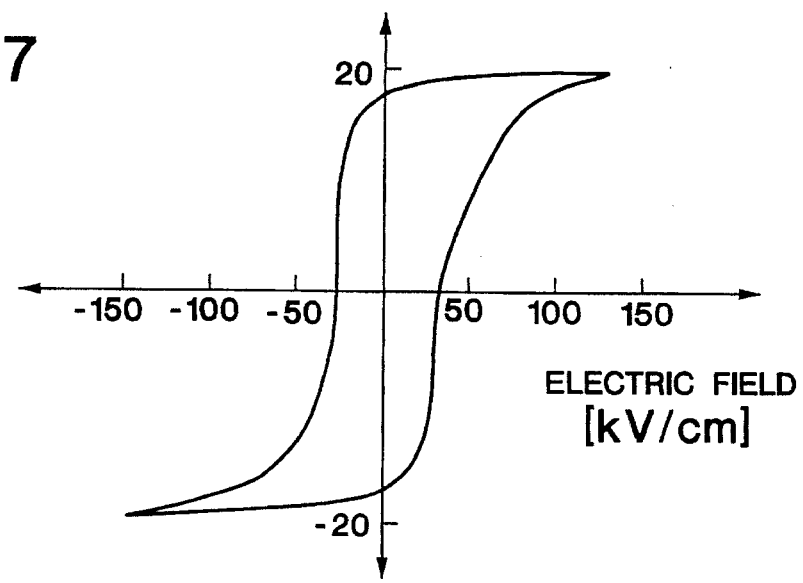
FIG. 7 is a hysteresis loop obtained by the dielectric thin film device according to example 2 of the present invention.

FIG. 7 shows a hysteresis loop obtained by applying an electric field 9 between the Pt upper electrode 8 and the Pt lower electrode 4 of the ferroelectric thin film device prepared in the same manner as described above. The applied electric field 9 was a triangular wave having an intensity of 150 kV/cm and a frequency of 75 Hz. The hysteresis loop shows that ferroelectric properties were obtained which were sufficient to be used as a ferroelectric memory device. In addition, the SEM observation of the cross section and the surface state of the PZT films 5, 6 and 7 showed that no pin holes were generated and the surface was smooth.

COMPARATIVE EXAMPLE 2

A structure for evaluating a conventional dielectric thin film device is the same as comparative example 1. However, the method for manufacturing the dielectric thin film and the composition ratio were different from comparative example 1.

A PZT film 14 was formed under the following conditions; the substrate temperature was set to 700° C., the flow rate of the carrier gas and the flow rate of the diluted gas were FPb=150 sccm, Fzr=50 sccm, FTi=100 sccm, $FO_2$=700 sccm, and $FN_2$=300 sccm. The result of the X-ray defraction analysis of the film after the film had been formed showed that only the peak of the PZT single layer of Perovskite structure appeared. Thus, it was confirmed that the film had been crystallized.

Figure 8:
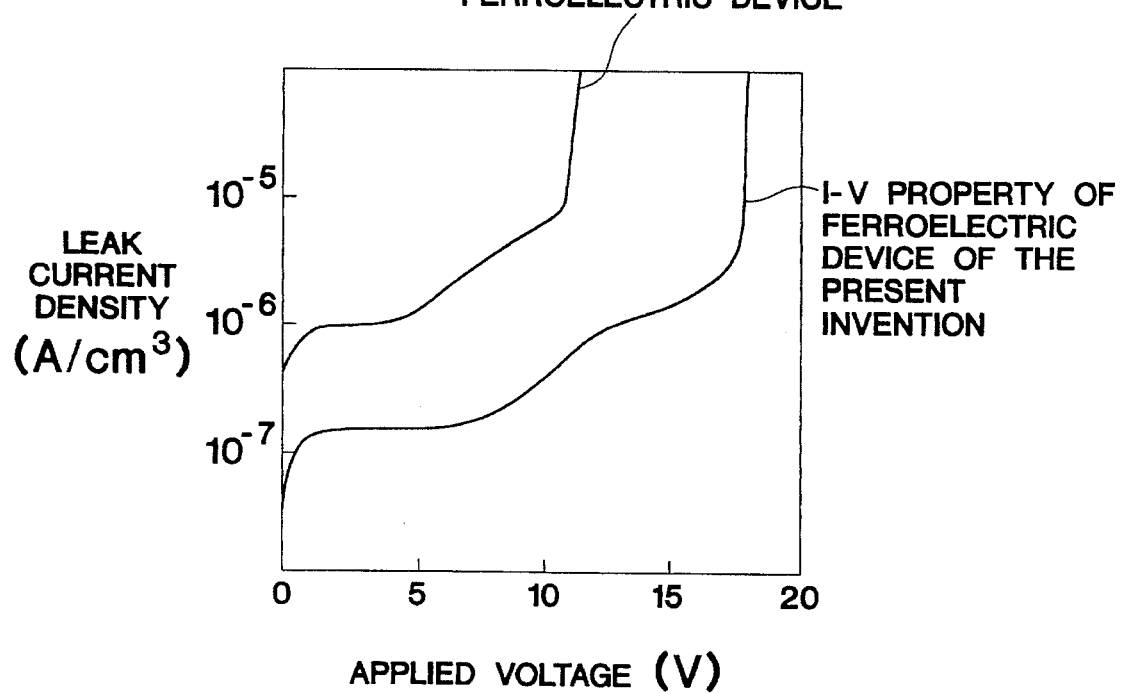
FIG. 8 is a comparative view showing I-V properties obtained by the dielectric thin film device according to example 2 of the present invention and the dielectric thin film device according to comparative example 2.

FIG. 8 shows a graph comparing the I-V properties between the ferroelectric thin film device in example 2 of the present invention and a conventional ferroelectric thin film device in comparative example 2. The graph shows that the ferroelectric thin film device of the present invention was improved in leak current and insulation dielectric strength and that the ferroelectric thin film has favorable properties as a ferroelectric memory device.

Incidentally, when the device was prepared by setting the composition ratio of the PZT film in example 3 to Pb: Ti: Zr=0.49: 0.21: 0.30, favorable properties similar to example 3 were obtained.

EXAMPLE 4

Example 4 of the present invention will be explained in conjunction with FIG. 9.

Figure 9:
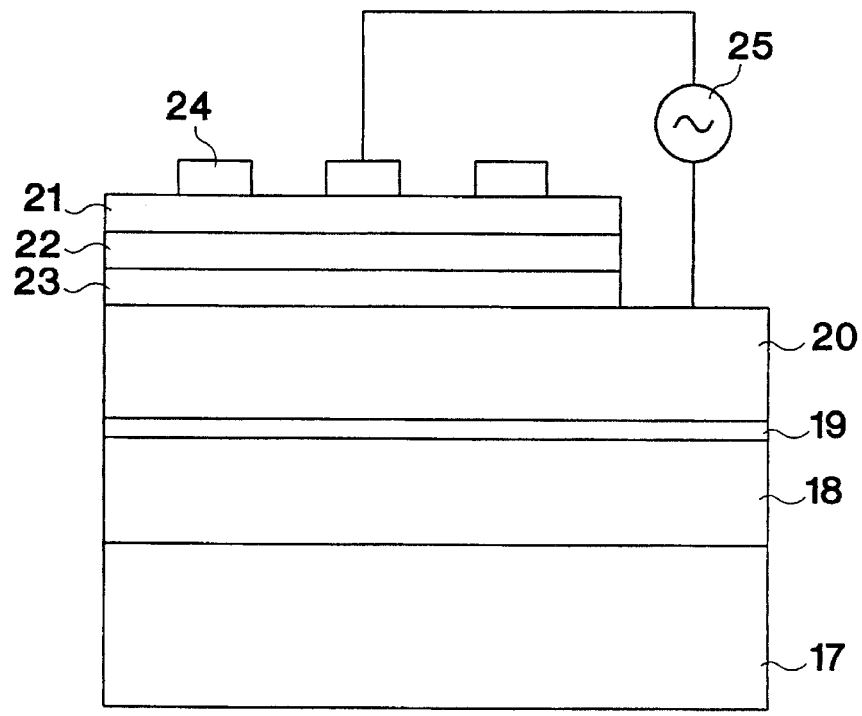
FIG. 9 is a schematic sectional view showing the dielectric thin film device according to example 4 of the present invention.

FIG. 9 is a schematic view showing a structure of one cross section of the dielectric thin film device of the present invention. Reference numeral 17 designates an N-type silicon substrate, 18 an Si thermal oxidation film formed on the surface of the N-type silicon substrate 17, 19 a Ti film formed on the Si thermal oxidation film 18, 20 a Pt lower electrode formed on the Ti film 19, 21 a first layer of a $SrTiO_3$ film formed on the Pt lower electrode 20, 22 a second layer of the $SrTiO_3$ film formed on the first layer 21 thereof, 23 a third layer of the $SrTiO_3$ film formed on the second layer 22 thereof, and 24 a Pt upper electrode formed on the third layer 23 of the $SrTiO_3$ film.

On the surface of the N-type silicon substrate 17, an Si thermal oxidation film 18 is formed to a thickness of 2000 Å followed by forming the Ti film 19 to a thickness of 300 Å on this Si thermal oxidation film 18 and then the Pt film 20 to a thickness of 2000 Å on the Ti film 19. Then SrTiO3 films 21, 22 and 23 were formed on the Pt film as a high dielectric film at a substrate temperature of 550° C. and an ion beam acceleration voltage of 1000 V to a thickness of 700 Å respectively so as to constitute a total thickness of 2100 Å. A composition ratio of the film was Sr/Ti=1 when the film was formed independently under the same condition as the $SrTiO_3$ films 21 and 23. A composition ratio of the film was Sr/Ti=0.8 when the film was formed independently under the same condition as the PZT film 22.

After SrTiO3 films 21, 22 and 23 were formed, the Pt upper electrode 24 was formed on the surface of the SrTiO3 film 23 by vacuum deposition method. The Pt upper electrode was rectangular having a size of 60 μm×60 μm and a thickness of 2000 Å.

The dielectric constant of the dielectric thin film was 220 when the film was prepared in the above method. In addition, an observation of the cross section and the surface state of the SrTiO3 films 21, 22 and 23 by the SEM showed that no pin holes were generated and the surface was smooth.

COMPARATIVE EXAMPLE 3

Figure 10:
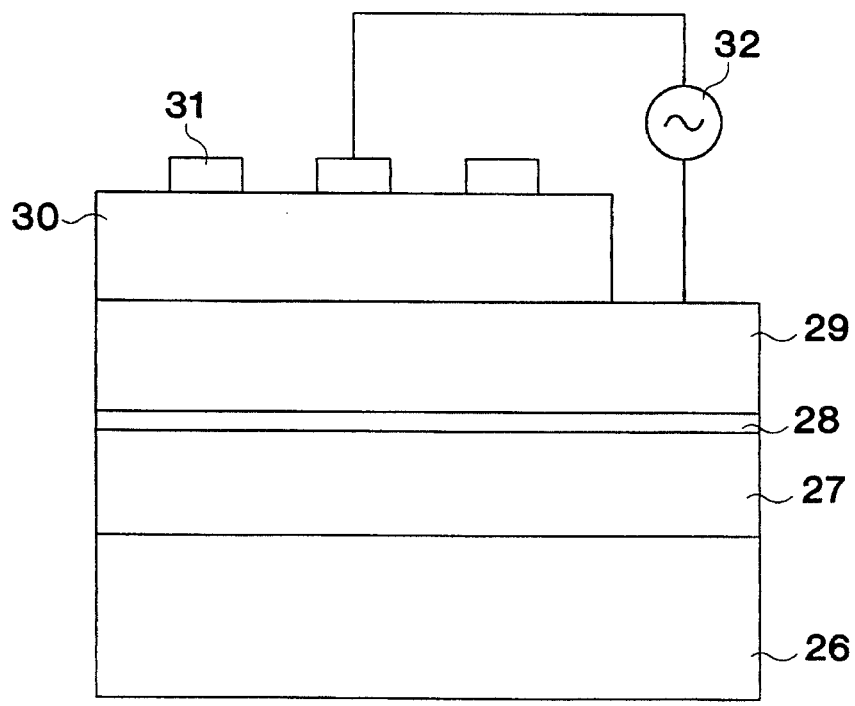
FIG. 10 is a schematic sectional view showing the dielectric thin film device according to comparative example 3.

FIG. 10 is a schematic sectional view showing a structure of a cross section for evaluating a conventional dielectric thin film device. Reference numeral 26 designates an N-type silicon substrate, 27 an Si thermal oxide film formed on the surface of the N-type silicon substrate 26, 28 a Ti film formed on the Si thermal oxide film 27, 29 a Pt lower electrode formed on the Ti film 28, 30 a $SrTiO_3$ film formed on the Pt lower electrode 29, and 31 a Pt upper electrode formed on the $SrTiO_3$ film 30. A method for forming a film other than the $SrTiO_3$ film 30 was the same as described above. The conditions for forming the $SrTiO_3$ film 30 was as follows; the substrate temperature was 550° C., and the ion beam acceleration voltage was 1000 V. As a result of the X-ray diffraction analysis, it has been confirmed that only the peak of the single layer of $SrTiO_3$ film appears and the layer is crystallized.

Figure 11:
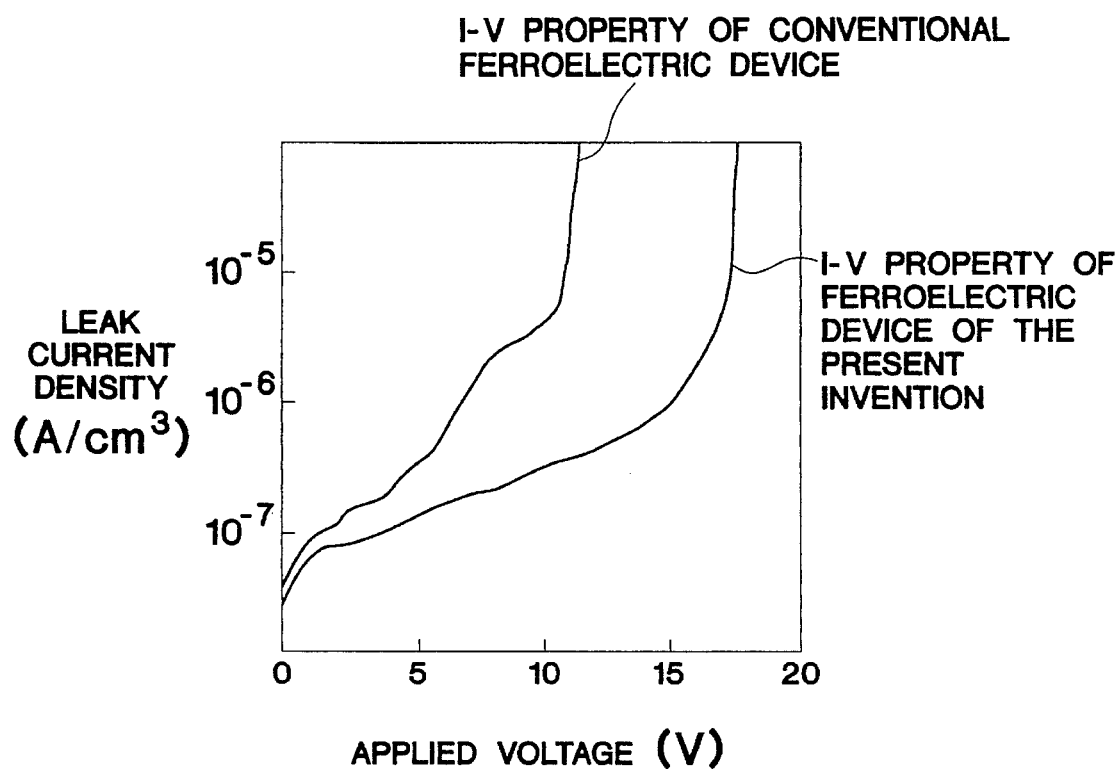
FIG. 11 is a comparative view showing I-V properties obtained by the dielectric thin film device according to example 4 and the dielectric thin film device according to comparative example 3.

FIG. 11 is a graph comparing I-V properties of the dielectric thin film device of the present invention in example 4 and those of the conventional dielectric thin film device in comparative example 3. The dielectric thin film device of the present invention has been improved in terms of leak current, dielectric breakdown voltage. The graph shows that the dielectric thin film has favorable properties as the dielectric memory device.

Incidentally, when the device is prepared by setting the composition ratio of $SrTiO_3$ film 23 in example 4 to Sr/Ti= 0.88, excellent properties were given in the same manner as example 4.

EXAMPLE 5

Figure 12:
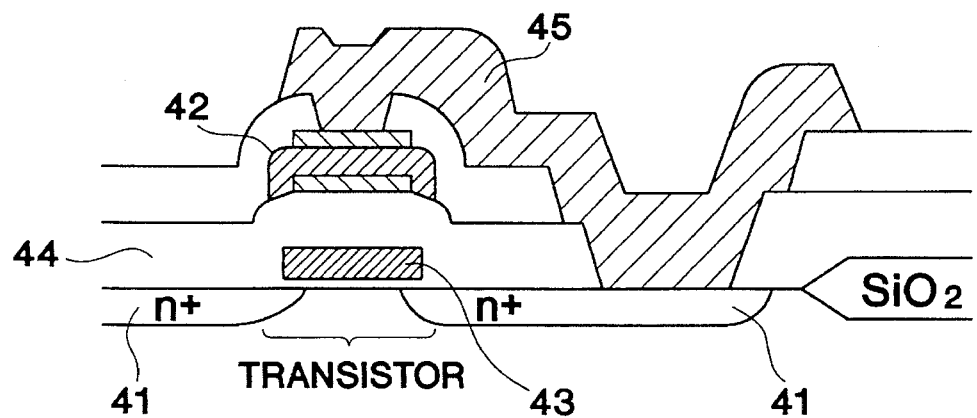
FIG. 12 is a view showing a non-volatile memory having a capacitor structure using the dielectric thin film device according to the present invention.

A non-volatile memory device having a capacitor structure as shown in FIG. 12 was prepared by using a dielectric thin film as shown in Example 1. In the non-volatile memory device, a transistor 46 comprised bit lines 41 and a word line 43 provided on the surface of the substrate between bit lines 41. Then, a ferroelectric thin film 42 was arranged which was sandwiched between electrodes having a capacitor structure above an insulating film 44. Furthermore, the ferroelectric thin film 42 has a structure connected with the bit line 43 by an Al interconnection 45.

When a voltage was applied to the ferroelectric thin film 42 in this memory device, the potential difference changed in the bit line 41 depending on whether the direction of the capacitor polarization was reversed or not. This allows defining the potential as "0" and "1". Since the ferroelectric thin film 42 had a remnant polarization, the state of "0" and "1" could be held even when the power source was turned off. The holding of the state of "0" and "1" led to the realization of the operation of the non-volatile memory device.

Furthermore, in this structure, the device is also operated as DRAM by using the high dielectric constant of the ferroelectrics. It is possible to operate the non-volatile memory device only when the power source is turned off.

EXAMPLE 6

Figure 13:
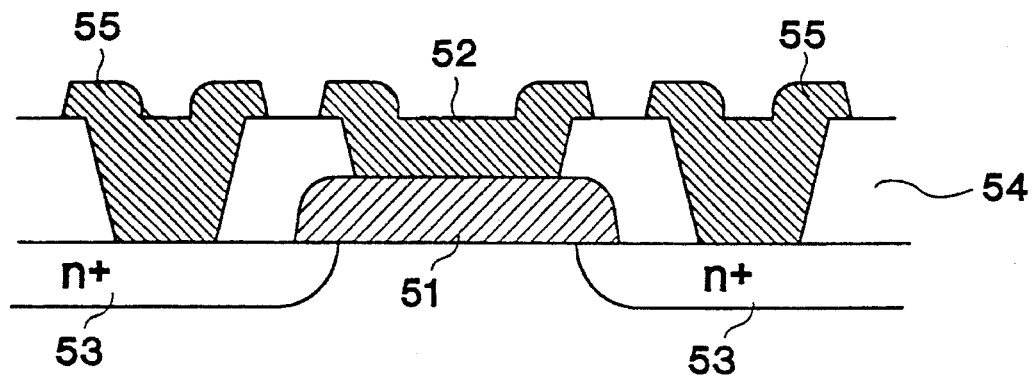
FIG. 13 is a view showing a gate non-volatile memory FET using the dielectric thin film device of the present invention.

A ferroelectric gate non-volatile memory FET was prepared as shown in FIG. 13 by using a dielectric thin film shown in example 1. This FET is provided with a source and drain regions 53 on the surface layer of the substrate, and a ferroelectric thin film 51 is provided on the substrate between the source and drain regions 53. Furthermore, a gate electrode 52 and the source and drain electrode 55 are insulated with an insulating film 54.

In this FET, since the formation of the channel on the surface of the semiconductor is controlled by applying a voltage to the gate electrode 52 and changing the polarization direction, the ON and OFF of the drain current defines "0" and "1".

Incidentally, since the ferroelectrics have a remnant polarization, the state of "0" and "1" can be held even when the source power is turned off. Thus, the operation of the non-volatile memory device can be realized.

EXAMPLE 7

Figure 14:
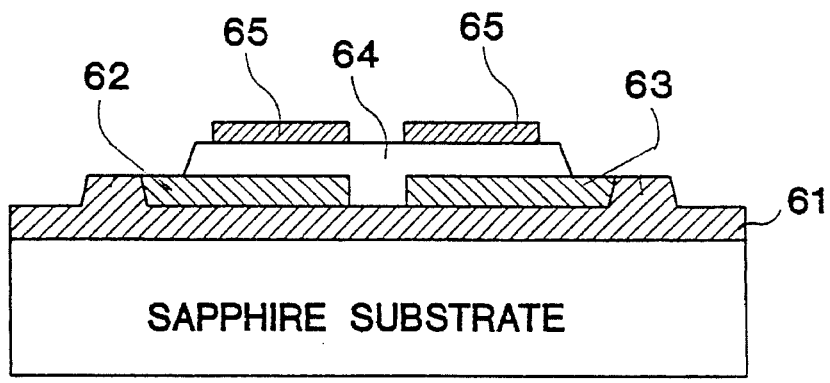
FIG. 14 is a view showing a light modulation device of wave guide channel type using a dielectric thin film device of the present invention.

As an light modulation device of a wave guide channel type as shown in FIG. 14 was prepared by using a dielectric thin film shown in example 1. In this light modulation device, a dielectric thin film 61 is laminated on the sapphire substrate, and then a wave guide channel comprising a port 62 and a port 63 are provided on this dielectric thin film 61. The two wave guide channels are separated by a buffer layer 64 and except for part of the upper surface of the two wave guide channels is covered with the buffer layer 64. In addition, Al electrode 65 is arranged on the port 62 and the port 63 with the buffer layer sandwiched therebetween.

This light modulation device uses an electro-optic effect of the dielectrics in which the refractive index changes with the applied electric field. In the structure of the light modulation device, as shown in the FIG. 14, the two wave guide channels 62 and 63 are intersected to each other to provide an electrode 64 having a fine gap in the center of the intersecting portion. When a voltage is applied to the light modulation device, the refractive index locally changes with the electric field centering on the gap. Here light is entirely reflected to provide a wave guide channel light switch of an overall reflection type.

EXAMPLE 8

Figure 15:
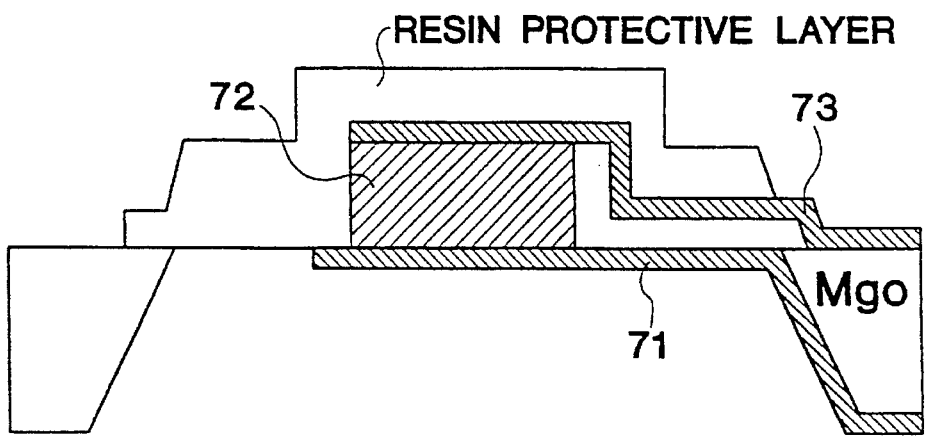
FIG. 15 is a view showing a pyroelectric infrared rays linear array sensor of thin film type using a dielectric thin film device of the present invention.

A pyroelectric infrared ray linear sensor of a thin film type was prepared as shown in FIG. 15 by using a dielectric thin film shown in example 1. The linear sensor of this type has a structure in which a dielectric thin film 72 is sandwiched between the Ni—Cr photodetecting surface electrode 71 and the array electrode 73.

The infrared rays linear sensor of this type uses a pyroelectric effect in the dielectrics, namely a phenomenon in which electric charge is generated on the surface in response to the change in temperatures. This sensor irradiates the surface of the dielectric thin film 72 with infrared rays so that the temperature changes when the infrared rays are absorbed. Consequently, the infrared rays can be detected by detecting the voltage and collecting electrode current generated at this time.

EXAMPLE 9

Figure 16:
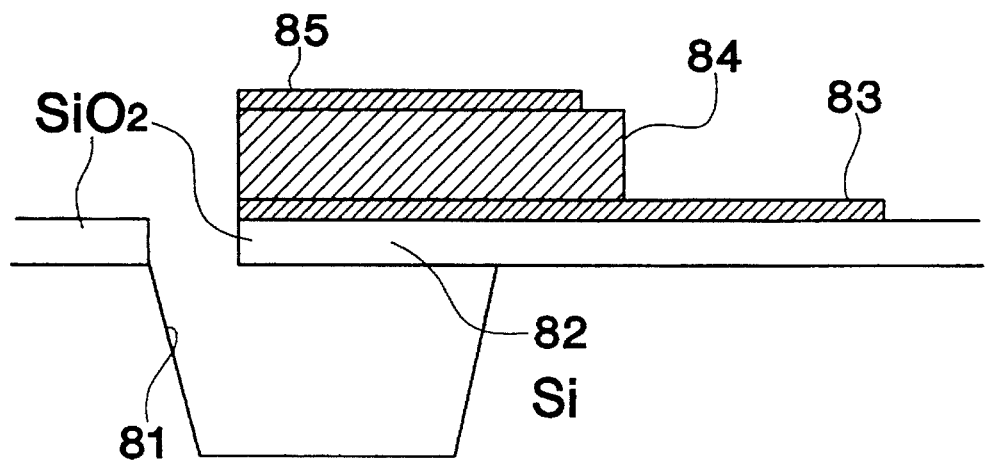
FIG. 16 is a view showing a ultrasonic sensor using a dielectric thin film device of the present invention.

An ultrasonic wave sensor was prepared as shown in FIG. 16 by using a dielectric thin film shown in Example 1. This sensor is provided with a half support beam 82 comprising $SiO_2$ on a substrate provided with a resonance common groove 81 so as to cover part of the groove 81. Furthermore, on this beam 82 a Pt/Ti electrode 83, a dielectric thin film 84 and an Al electrode 85 are formed in this order.

The ultrasonic wave sensor of this type uses a piezoelectric effect of the dielectrics, namely a phenomenon in which an electric polarization is generated in proportions to a mechanical stress when the mechanical stress is applied to the dielectrics. When the sensor receives the ultrasonic waves, the half support beam 82 resonates with the sound pressure. The bending of the dielectric thin film 84 generates a piezoelectric effect thus generating a voltage between electrodes. This facilities the control of the resonance frequency properties by changing the size and thickness of the beam 82, and the voltage.

EXAMPLE 10

Figure 17:
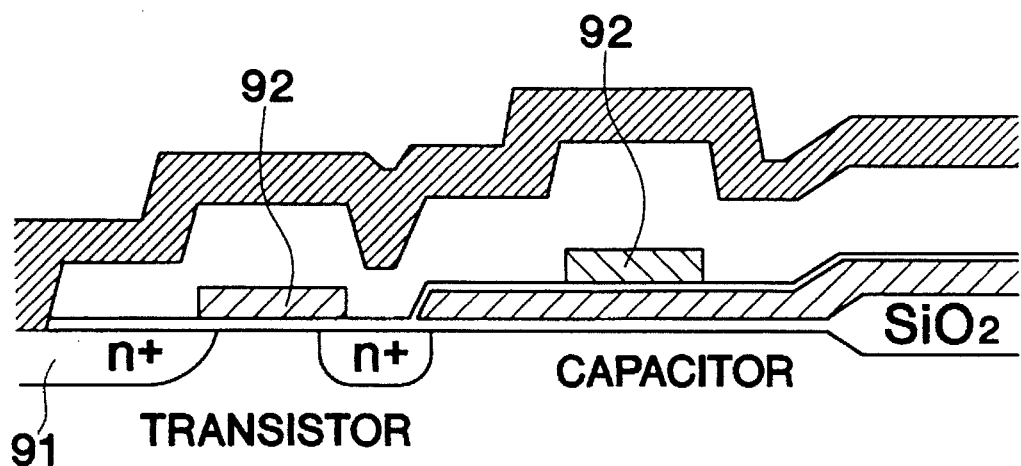
FIG. 17 is a view showing a dynamic random access memory (DRAM) using a dielectric thin film device of the present invention.

As shown in FIG. 17, a DRAM was prepared by using the dielectric thin film shown in example 1. The DRAM comprises a bit line 91 provided on the surface layer of the substrate, a word line 92 provided on the substrate, and a capacitor including a dielectric thin film and a plate electrode.

In the DRAM, the electric charge of the capacitor changes depending on whether a voltage is applied to the dielectric thin film. In such case, value "0" and "1" can be defined from the potential difference generated in the bit line.

Incidentally, in the above examples 5 through 10, a case was described in which the ferroelectric thin film in example 1 was used. However, the ferroelectric thin film in examples 2 through 3 can be used in the same manner. In addition, the high dielectric thin film in example 4 is preferably used in examples 8 through 10.

In addition, it goes without saying that the dielectric thin film containing other kinds of volatile devices which have the ferroelectric effect, the piezoelectric effect, and the electro-optical effect can be applied to examples 5 through 10.

The present invention can provide a dielectric thin film device free from the generation of pin holes owing to reevaporation or the like of a volatile device in the midst of crystallization and having a small leak current density and an improved dielectric breakdown voltage, the dielectric thin film device being easily formed owing to a reduction in uneven patterns on the surface thereof.

The preferred embodiments are therefore illustrative, not restrictive, the scope of the invention being indicated by the appended claims and all variation which come within the meaning of claims are intended to be embraced therein.

What is claimed is:

1. A dielectric thin film device comprising:
   at least one electrode; and
   a dielectric thin film, said dielectric thin film being a laminate of at least three layers including an intermediate layer, the composition of each layer comprising atoms of like kind, including at least one volatile atom, the content of the at least one volatile atom being smaller in the intermediate layer than in at least two of the remaining layers, a first of the at least two remaining layers being disposed on a first side of the intermediate layer and a second of the at least two remaining layers being disposed on a second side of the intermediate layer opposite the first side.

2. The dielectric thin film device of claim 1 wherein said dielectric thin film is a ferroelectric thin film.

3. The dielectric thin film device of claim 1 wherein said at least one volatile atom is selected from the group consisting of lead, bismuth, strontium, barium, lithium, calcium, potassium and sodium.

4. The dielectric thin film device of claim 1 wherein the at least three layers are layers formed by one of a sputtering method, a metal organic chemical vapor deposition method, ion beam sputtering method and a sol-gel method.

5. The dielectric thin film device of claim 4, wherein the laminate is subjected to heat-treatment for crystallization.

6. The dielectric thin film device of claim 4, wherein the at least two of the remaining layers are layers formed by the metal organic chemical vapor deposition method under a common substrate temperature and material gas, wherein a composition ratio of the at least one volatile atom is changed in a carrier gas.

7. The dielectric thin film device of claim 4, wherein the at least two of the remaining layers are layers formed by the ion beam sputtering method under a common substrate temperature, ion beam acceleration voltage and a sputtering gas pressure, wherein a composition ratio of the at least one volatile atom is changed in a sputtering gas.

8. The dielectric thin film device of claim 1, wherein the first remaining layer is an upper layer and the second remaining layer is a lower layer, the upper and lower layers contacting and sandwiching the intermediate layer, said intermediate layer containing a smaller content of the at least one volatile atom than said upper and lower layers.

9. The dielectric thin film device of claim 1, wherein the remaining layers include at least one upper layer and at least one lower layer sandwiching said intermediate layer, said intermediate layer containing a smaller content of the at least one volatile atom than at least one of the at least one lower layer.

10. The dielectric thin film device of claim 9, wherein said intermediate layer contains a smaller content of the at least one volatile atom than at least one of the at least one upper layer.

* * * * *